United States Patent
Wang et al.

(10) Patent No.: US 9,520,696 B2
(45) Date of Patent: Dec. 13, 2016

(54) PROCESSES FOR MAKING RELIABLE VCSEL DEVICES AND VCSEL ARRAYS

(71) Applicant: Princeton Optronics Inc., Mercerville, NJ (US)

(72) Inventors: Qing Wang, Plainsboro, NJ (US); Jean-Francois Seurin, Princeton Junction, NJ (US); Chuni L Ghosh, West Windsor, NJ (US); Laurence S Watkins, Pennington, NJ (US)

(73) Assignee: PRINCETON OPTRONICS INC., Mercerville, NJ (US)

( * ) Notice: Subject to any disclaimer, the term of this patent is extended or adjusted under 35 U.S.C. 154(b) by 44 days.

(21) Appl. No.: 14/634,902

(22) Filed: Mar. 2, 2015

(65) Prior Publication Data

US 2015/0255955 A1 Sep. 10, 2015

Related U.S. Application Data

(60) Provisional application No. 61/947,723, filed on Mar. 4, 2014.

(51) Int. Cl.
*H01L 21/00* (2006.01)
*H01S 5/022* (2006.01)
(Continued)

(52) U.S. Cl.
CPC ......... *H01S 5/0224* (2013.01); *H01S 5/18305* (2013.01); *H01S 5/18311* (2013.01);
(Continued)

(58) Field of Classification Search
None
See application file for complete search history.

(56) References Cited

U.S. PATENT DOCUMENTS 5,594,751 A 1/1997 Scott
5,978,408 A * 11/1999 Thornton ............ H01S 5/18338
372/45.01
(Continued)

FOREIGN PATENT DOCUMENTS

EP 0905835 3/1999

OTHER PUBLICATIONS

Hawkins B., et al, "Reliability of Various Size Oxide Aperture VCSELs", Report from Finisar Advanced Optical Components Division, Finisar Corporation, Sunnyvale, CA, 2007.

*Primary Examiner* — Sonya D McCall Shepard

(57) ABSTRACT

A set of VCSEL fabrication methods has been invented which enhance the performance and long time reliability of VCSEL devices and arrays of devices. Wafer bow caused by growing a large number of epitaxial layers required to fabricate VCSEL device generates strain and results in bowing/warping of the device wafer. The stress so generated is eliminated by applying a stress compensation layer on the substrate to a surface opposite to the epitaxial layer surface. New oxidation equipment designs and process parameters are described which produce more precision apertures and reduce stress in the VCSEL device. An ultrathin fabrication procedure is described which enables high power VCSELs to be made for high power operation at many different wavelengths. A low temperature electrical contacting process improves VCSEL long term reliability.

18 Claims, 12 Drawing Sheets

(a)

(b)

(51) Int. Cl.
    *H01S 5/183*     (2006.01)
    *H01S 5/042*     (2006.01)
    *H01S 5/42*     (2006.01)
    *H01S 5/02*     (2006.01)

(52) U.S. Cl.
    CPC   *H01S 5/18347* (2013.01); *H01L 2224/48091* (2013.01); *H01L 2224/73265* (2013.01); *H01S 5/0203* (2013.01); *H01S 5/0217* (2013.01); *H01S 5/0425* (2013.01); *H01S 5/423* (2013.01)

(56) References Cited

U.S. PATENT DOCUMENTS

| | | |
|---|---|---|
| 6,898,215 B2 | 5/2005 | Naone et al. |
| 7,286,584 B2 | 10/2007 | Wang et al. |
| 7,346,090 B2 | 3/2008 | Johnson et al. |
| 8,093,143 B2 | 1/2012 | Storck et al. |
| 8,411,722 B2 | 4/2013 | Hori |
| 8,451,875 B2 | 5/2013 | Johnson |
| 2005/0019973 A1 | 1/2005 | Chua |
| 2005/0184303 A1 | 8/2005 | Tandon et al. |
| 2013/0099357 A1 | 4/2013 | Dargis et al. |
| 2013/0270575 A1 | 10/2013 | Humphreys et al. |

\* cited by examiner

PROCESSES FOR MAKING RELIABLE VCSEL DEVICES AND VCSEL ARRAYS

CROSS REFERENCE TO RELATED APPLICATION

This application claims priority benefit from the U.S. Provisional Patent Application No. 61/947,723 filed on Mar. 4, 2014, the contents of which is being incorporated by reference in their entirety.

BACKGROUND OF THE INVENTION

Field of Invention

This invention relates to a method and in particular, to a sequence of fabrication steps for constructing semiconductor lasers, and in particular, vertical cavity surface emitting lasers (VCSELs) and arrays of VCSELs, exhibiting long term stability and reliability.

Background Art

The fabrication processes for making VCSELs involve a series of steps as shown in a process flow diagram shown in FIG. 1. A VCSEL or VCSEL arrays (synonymously referred as VCSEL devices hereinafter) are grown on a semiconductor substrate and in general, includes steps of one or more layers of epitaxial crystal growth, growth or deposition of different materials to facilitate etching of layers, lithography, metallization, polishing, bonding, dicing and cutting, etc. While each process and its implementation is optimized for better device performance, design, engineering and execution of these processes has a direct impact on device performance including stability and long term reliability. The number of steps and in particular, the number of epitaxial layer growth steps for constructing VCSEL device is much larger than for other semiconductor optical devices. Therefore, designing a process applicable for high volume and large area wafers in manufacturing environment is particularly challenging due to stress arising from one or more process steps including growth of large number of epitaxial layers.

Bulk single crystal semiconductor is grown using high precision processes and are cut into discs and polished to obtain high quality wafer surfaces as the starting substrate material for growing one or more epitaxial layers to construct VCSEL devices. One of many methods such as Metal-Organic Chemical Vapor deposition (MOCVD) and/or Molecular beam Epitaxy (MBE) are well known in the art to grow epitaxial layers with precise composition and thickness control. Such epitaxial layers are used to construct reflectors including Distributed Bragg Reflectors (DBR) and dielectric mirrors as well as the active gain region to form a laser cavity, aperture layer(s) for current confinement, etch stop layer and electrical contact layers. Typically, a large number of layers of desired composition are grown to achieve a structure having a complex optical profile of the VCSEL device that different applications of such VCSEL devices may need. For example, in one application described in the U.S. Pat. No. 8,411,722, epitaxial layers are grown with a composition and thickness to impart a wide reflectivity profile to at least one reflector for stable operation.

The number of layers required, and complexity of composition and thickness requirements are described in many prior art patent and non-patent literature publications. U.S. Pat. Nos. 5,594,751, 6,898,215, 7,286584, 8,451875, United States Patent Application Publication No. 2005/0019973 and European Patent Application Publication No. EP0905835 are cited here to highlight the requirements of epitaxial growth layers to construct a VCSEL device. Most of the structures described in the above cited literature are grown on III-V semiconductor substrate. Since a large number of thin layers having slightly different lattice properties are grown successively, one common aspect is that lattice strain is induced in the active layer during the process. The strain in the active region may generate defects and/or dislocations in the resulting structure which affect stable operation and reliability.

A common way to improve stability and reliability in most VCSEL device structure is to deliberately introduce a strain of opposite kind, in one or more layer (strain layer) in the stack of epitaxial layers to compensate for the overall lattice strain, which require precise control on composition and thickness. The strain layer may be placed at one or several levels in the entire stack of the plurality of epitaxial layers (most common approach) or at a specific level for example, next to an oxidation layer as described in the United States Patent Application Publication No. 20050184303. Different approaches to mitigate strain in the active layer may be followed when VCSEL devices are constructed on Silicon (Si) or other substrates depending upon the emission wavelength. For example, in the United States Patent Application Publication No. 2013/0270575, a VCSEL device constructed using Gallium Nitride (GaN) on a Si substrate, is described where active layer strain is mitigated using one or more Silicon Nitride ($SiN_x$) interlayers placed at one or more specific positions in a stack.

The number, complex compositions and precision control on composition and thickness of the epitaxial layers involved in the construction of VCSEL devices is much higher than for other typical semiconductor optical devices. As a result there is high degree of variations in the crystal lattice dimensions between adjacent or overlying layers. These structural modifications which are critical for intended device operation, results in inducing strain in the epitaxial layers and also between the epitaxial layers and the substrate wafer. Thus significant bowing and/or warping of the wafer (including the epitaxial layers) may occur, which not only induces strain in the device but lack of flatness is particularly detrimental for some critical processing steps for example lithography, on a large area and/or thin substrates used in a manufacturing environment, and therefore impacts yield.

Introducing a specially designed strain compensation layer is often used in growing epitaxial layers on dissimilar substrates for example growing III-V or III-N (GaN) optical layer on a Si substrate. In the United States Patent Application Publication No. 20130099357 a method to grow III-N optical layer on a Si substrate is described. More specifically, a rare earth oxide (REO) layer is first grown on the Si substrate as a strain compensation layer prior to growing of the III-N layer over the strain compensation layer. The resulting combination reduces bow in the III-N material. Notably, the strain compensation layer and the III-N layer are deposited in tandem on the same side of the substrate. In a U.S. Pat. No. 8,093,143, a stress compensating layer comprising of a constant composition of SiGe of a desired thickness is grown on the back side of a Si wafer to change the growth process of a Si—Ge layer grown on the front side of the Si wafer. It was observed that the defects on the film as well as bowing were reduced. However, the process introduced other defects that compromise device performance.

While strain layers are incorporated in the epitaxial layer structure for reducing defects in the gain region, in most prior art designs of VCSEL devices cited earlier, mitigating bow and/or warp arising from the epitaxial layer structure has never been considered to be an important process step, more so when epitaxial layers and the substrate are from the same family of compounds (InGaAs/GaAs,GaAlAs on GaAs substrate, for example), and/or for small area wafers (3" diameter or less). Furthermore, incorporating an appropriately designed strain compensation layer on the substrate on a surface opposite to the epitaxial layer structure is not considered or incorporated in the design of a fabrication process before.

Another critical fabrication step in the VCSEL construction is forming current and optical mode confining apertures for ensuring high optical gain and desired optical mode characteristics. While the optical aperture may be created during a metallization step, the current confining aperture is formed by proton implantation as described for example in U.S. Pat. No. 7,346,090. More recently, oxidizing a suitably placed epitaxial layer of a specific composition at one or more positions within the epitaxial layers stack has emerged as a more preferred option to create the current confinement aperture as described in the U.S. Pat. No. 5,594,751. In this particular patent it is described that the aperture size should preferably be smaller than the beam waist diameter such that a single oxide aperture suffices for current and optical mode confinement.

More detailed account of the advantages of oxide aperture is provided in non-patent literature publication in a report published by Finisar entitled "Reliability of Various Size Oxide Aperture VCSELs", first published in Proceedings of $52^{nd}$ Electronic Component and Technology Conference 2002, vol. 52, pp. 540-550 (doi: 10.1109/ECTC.2002.1008148). One important drawback of oxide apertures arises from the volume of oxide present in the VCSEL device that may introduce stress and affect reliability. In the U.S. Pat. No. 6,949,473 it is described that for low current operation of the VCSEL device the oxide aperture diameter must be small as compared to the mesa diameter. However, a large volume of oxide grown to reduce the aperture diameter to a required size as compared to the mesa diameter may result in significant difference in thermal expansion rates of the VCSEL epitaxial layers and the oxide region, causing stress and thereby affecting reliability.

Current confinement and confinement of a preferred optical mode is achieved by a two aperture design. In the European Application Publication No. EP1496583, a first oxide ring in the epitaxial layer stack is used for current confinement whereas a second oxide ring around the mesa structure of the VCSEL device is used to cut down transverse optical modes thereby facilitating single mode operation to improve reliability. In a different design described in the United States Application Publication No. 2013/0034117, two apertures, one oxide aperture to confine current and a second oxide aperture to confine a preferred optical mode are utilized. In another approach described in a U.S. Pat. No. 8,355,423 a non-circular current confinement aperture is used for promoting higher order lateral modes. One common factor in this approach is to have a predetermined ratio between the sizes of the two apertures as has also been described in the European Patent Application Publication No. EP1496583.

Temperature and thermal cycling during the oxidation process is also responsible for introducing strain in the wafer and in the epitaxial layers which in turn may contribute to the bowing and/or warping of the substrate wafer. Therefore it is important to design oxidation processes that are at lower temperature and follow slow thermal cycling to avoid stress in the wafer. Current confinement aperture constructed by oxidation has a second detrimental aspect. Besides the epitaxial growth and oxidation steps, there are several other process steps in VCSEL device construction that may strain/stress the device structure. Operation of VCSEL devices particularly at high power levels creates significant heat in the device.

Therefore optimum operation requires VCSELs to be designed with high thermal conductivity to dissipate heat which would otherwise limit performance and output power of the VCSEL. A preferred mounting configuration for high power operation of VCSEL devices is in the bottom emission mode where VCSEL device is bonded to a high thermal conductivity submount with the substrate distal to the submount. In this configuration the output beam from the VCSEL devices traverses through the substrate. Therefore, operation of the VCSEL device is restricted to wavelength emissions that are not absorbed in the substrate. In one mode the substrate is either thinned to suitable thickness or completely removed by polishing and/or etching which may introduce further strain if wafer is not handled properly and in particular has bowing and/or warping during the thinning operation.

In a later processing step electrical contacts to the VCSEL device are made. Most often one or more lithography steps are performed to etch mesas, define the areas to be selectively metallized to define the contact areas, and so forth. The lithography step may precede or follow the metallization step according to the process design. A flat wafer surface free of bowing and/or warping is necessary for accurate geometry of the mesas and metallization features to be defined on the wafer. Flatness of the wafer, particularly for a large area wafer in a manufacturing environment is absolutely necessary for better yield. Typical metallization deposition is performed at elevated temperature to ensure good adhesion of the metal layer to the semiconductor material of the VCSEL device to realize low electrical resistance of the metallization contact. However, high temperature process can introduce defects into the device and potentially degrade the properties of the device structure fabricated in earlier process steps. Therefore, a low temperature metallization process will be a preferred choice for making electrical contacts to the VCSEL device without compromising stable and reliable operation over long time.

Another process step that may introduce stress in the epitaxial layers of VCSEL device is the final step of dicing the wafer into individual chips. The dicing saw or even the dicing scribe has the potential to create crystal defects which can then propagate into the epitaxial region of the VCSEL device or arrays of devices. These defects may affect one or more properties of the VCSEL epitaxial layers thereby reducing inherent gain of the device causing optical loss and impacting long term stability and reliability.

Although many process steps for constructing of VCSEL devices are well known, and have been optimized for smaller size wafers and for particular material systems, applying same process steps to large size wafers and/or to thin wafers is particularly challenging because bowing and/or warping of wafers may be sufficiently large to affect the flatness of the wafer in subsequent post epitaxial layer growth processing steps, for example, while performing critical alignment steps such as lithography, substrate thinning/removal, metallization, etc. In addition, wafer bowing and/or warping is particularly detrimental in bonding the finished VCSEL device to a submount including a thermal submount or a printed circuit board with or without a region for efficient heat dissipation, which affects the performance of high power VCSEL devices in particular. Efficient heat dissipation is only possible if the VCSEL device is positioned flat and in close contact with the submount. In case of a thin wafer the bowing may even cause breakage thereby resulting in poor yield.

Standard prior art VCSEL device processing methods are quite advanced, but still do not address or provide a solution to this important issue of bowing and/or warping which poses challenges in adapting standard VCSEL device processing on a large area wafer particularly for large scale manufacturing environment. There are many steps that may introduce stress in the structure which degrades performance and ultimately compromises reliability and leads to device failure. Therefore there is a need to design a fabrication process and apply the process steps in a preferred order to mitigate or minimize the effects of wafer bowing and/or warping. One objective of this invention is to minimize stress on VCSEL device wafer thereby improving long term stability and reliability. In this invention a number of process steps are provided that when applied in a prescribed sequence has demonstrated to reduce overall stress and improve long term stability and reliability. VCSEL device fabricated in accordance with the process design of this invention on a large area wafer and operated at optical power levels exceeding 1 Watt (W) exhibit improvement in reliable performance by a factor of 20 or more.

SUMMARY OF THE INVENTION

In this invention a process to fabricate a VCSEL device wafer with significantly improved reliability is provided. In one embodiment of the invention a strain compensating film is provided. More specifically the strain compensating film on the semiconductor wafer to counteract significant bowing and/or warping in the wafer which is induced due to strain in multiple epitaxial layers.

In one aspect of the invention a film of material is deposited at high temperature on the substrate surface on the opposite side of the epitaxial layers. The material and the thickness selected for the film preferably has a thermal expansion coefficient different than that of the epitaxial layers resulting in opposite strain when the wafer is cooled to approximately room temperature. In a variant aspect of the invention it is determined that the strain compensating film constructed from silicon dioxide, silicon nitride, BCB, polyimide, and SU8 or materials of similar expansion coefficients are equally effective.

In one aspect of the invention a low temperature oxidation process is provided to construct a current and optical mode confinement aperture. The oxidation temperature is set to no more than 400° C. in a furnace that maintains a uniform temperature and flow rate of the oxidizing medium over an entire heating zone designed to simultaneously oxidize several large area wafers stacked vertically. In a variant aspect the oxidation environment is provided to have a nitrogen gas 100% saturated with water vapor.

The oxidation process provides good control over the oxidation rate to precisely control the width of the aperture. In a variant aspect the width of the aperture is limited to about 10 micrometer or less so as to minimize the total volume of the oxide zone. The wafers during oxidation are heated and cooled at slow rates to reduce overall stress. In one aspect the heating and cooling rates are set to about 20° C./min. or lower, respectively.

A further process step in the oxidization process that improves the long term reliability is to remove as much as possible the moisture present in the oxidized semiconductor, after the oxidation process. Moisture is introduced in the oxide during the oxidation process which uses water vapor.

In another aspect of the invention in the reduction of the bowing and/or warping of the VCSEL device wafer by incorporating the strain compensation film provides significant improvement in overall stress reduction in a number of process following the fabrication of VCSEL device wafer. The improvements are observed in the processes of lithography, mesa construction, thinning of the wafer for ultrathin VCSEL wafers, metallization, bonding to a submount for heat dissipation. In a different aspect additional reliability improvement is provided by a low temperature metallization process for constructing electrical contacts to the VCSEL devices.

In a variant aspect, an etching process is used for dicing the wafers instead of traditional method of sawing, thereby reducing overall stress of the VCSEL device wafer and improving reliability. The etching process for dicing includes Reactive Ion Etching (RIE), Inductively Coupled Plasma (ICP) etching. chemical etching or a combination of these processes.

The application of some or all of these fabrication processes and/or improvements has facilitated reducing overall stress and increased the performance of the VCSELs and VCSEL arrays and increased the long-term reliability by more than a factor of 20.

BRIEF DESCRIPTION OF THE DRAWINGS

Different aspects of the invention describing a broad framework of the invention are presented in the specification which will be better understood and appreciated in conjunction with the drawing figures in which—

DETAILED DESCRIPTION

Basic Process to Construct VCSEL Device

Figure 1A:
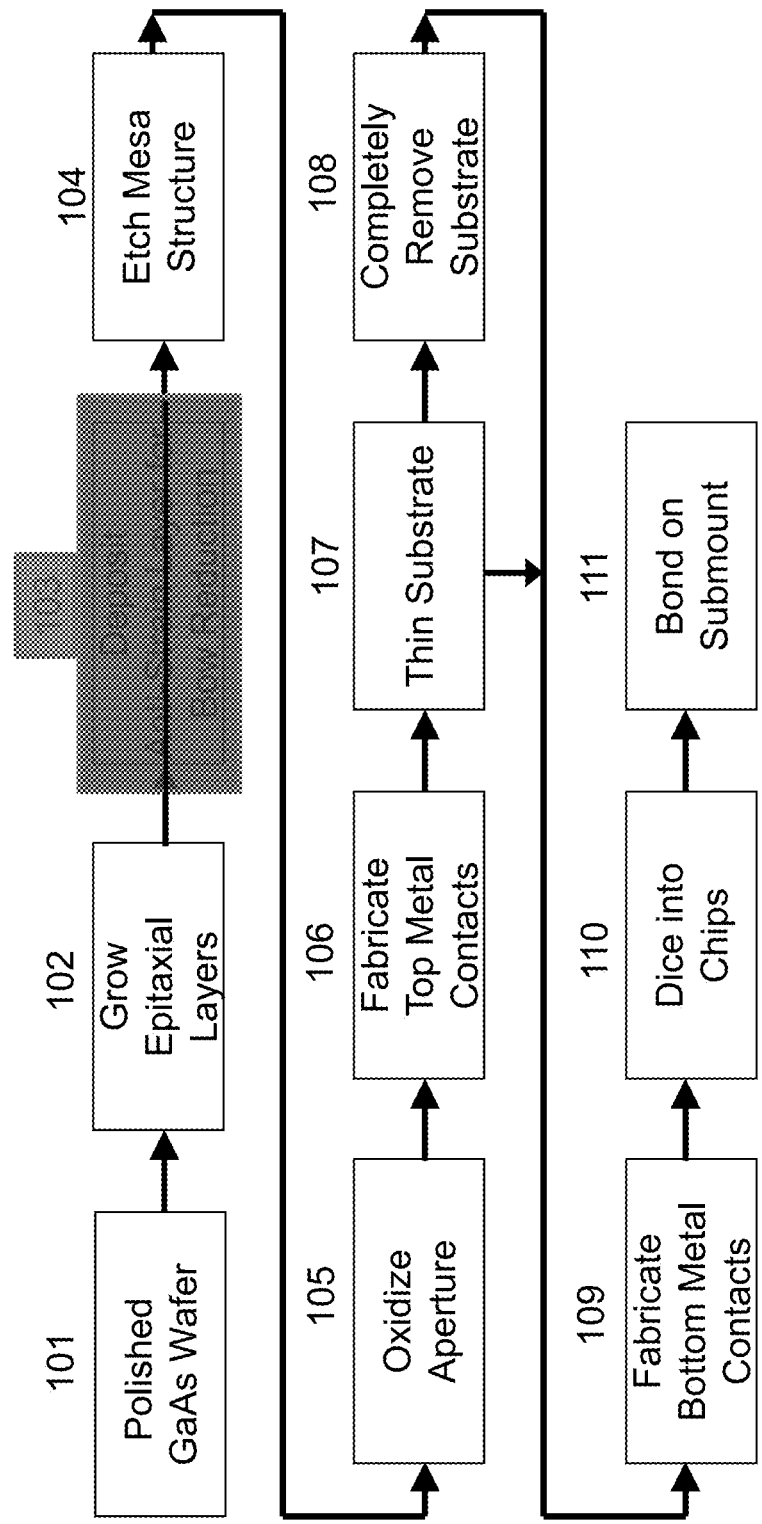
FIG. 1a is a flowchart showing a standard process sequence for fabricating a VCSEL device.

A broad framework of the principles will be presented by describing various aspects of this invention using exemplary embodiments and represented in different drawing figures. While the drawing figures show a structure, the structure is used to illustrate/describe a process that is used to create the structure. The process in this context is used synonymous to a method or a step in a sequence of processes that need to be carried out in a particular order to achieve a certain beneficial result for a given structure of a VCSEL device. For clarity and ease of description, each embodiment includes only a few aspects. Different aspects from different embodiments may be combined or practiced separately, to design a customized process depending upon application requirements. Many different combinations and sub-combinations of few representative processes shown within the broad framework of this invention, that may be apparent to those skilled in the art but not explicitly shown or described, should not be construed as precluded.

Majority of the standard processing methods are well known and particularly each step of processing is well known in the art. In the following discussion the term VCSEL device is used synonymously for a single VCSEL device or an array of monolithically integrated VCSEL devices unless stated otherwise. In general, process steps to be described are applicable to all VCSEL devices whether iced into single devices or arrays of VCSELs for constructing VCSEL chips. FIG. 1a shows a schematic flow chart of a standard processing sequence commonly used. Each box in the illustration represents an essential step or process and is self-explanatory.

More specifically, starting process (101) is always a crystalline semiconductor material cut into wafers of standard thicknesses and preferably highly polished to a mirror finish on at least one surface that is used as a substrate to support subsequent growth of one or more epitaxial layers (102). As an example, the substrate is selected to be a GaAs wafer. In the following description, the highly polished surface of the substrate will be typically referred as the top surface and the opposing surface as the bottom surface of the substrate. The bottom surface is typically not polished to a mirror finish unless required for a specific application.

Epitaxial layers of different compositions are typically grown on the top surface of the substrate in a sequential manner using methods like MOCVD, MBE, for example. In a stack of layers any layer(s) grown at an earlier time than another layer(s) is referred as a lower/bottom layer(s) and is the one towards the substrate. Epitaxial layers have different composition according to their requirement as reflectors including DBR, active gain layer, aperture layer, etch-stop layer and electrical contact layer, or any layer for special purpose. The composition and other parameters defining the layers are determined by the particular VCSEL device function and the subsequent fabrication and assembly processes. The latter will become more apparent during the following detailed discussion of the fabrication and assembly methods described later in steps (104-111). It is noted that a process step 103 is shadowed by a grey box and is bypassed in the schematic shown in FIG. 1. Step 103 is not part of the standard VCSEL device process. Step 103 is more specific to the current invention as will be apparent shortly in reference with the description of FIG. 1b shortly.

Referring back to FIG. 1a, in a following step (104) mesa structures are selectively etched through the epitaxial layers using standard lithography techniques commonly known in the art and will not be described further. Often one or more etch-stop layer(s) is suitably positioned in the stack of epitaxial layers for precision etching. An oxidation/aperture layer with a composition suitable for rapid oxidation relative to the other layers is placed within the stack of epitaxial layers. Exact position of the oxidation/aperture layer is determined according to the application the VCSEL device is intended for. A current and/or optical mode confinement aperture is created by controlled oxidation of the oxidation/aperture layer (105).

In subsequent steps (106-111) the electrical contact on the top end of the VCSEL device is applied followed by thinning the substrate or completely removing the substrate if required, and applying a metallization to the bottom side of the substrate or to the bottom contact layer as the case may be. The completed VCSEL device is diced using any of the standard dicing techniques to separate the individual VCSEL device or VCSEL arrays into chips to be mounted on a submount, preferably one capable of heat dissipation. Other process step may include surface or wire bonding electrical connections from the VCSEL device to the submount or another external mount such as a printed circuit board.

The basic steps of VCSEL device fabrication described in the previous paragraphs are the most common ones applicable for majority of the prior art devices. Furthermore many variations and additional optional steps also well known in the art, are often implemented to suit different requirements for different applications. However, none of the prior art devices address the issues related to bowing and/or warping of the wafer resulting from the stress introduced at different stages of VCSEL fabrication and in particular, after epitaxial layers growth in material systems typically used for constructing VCSEL devices. The large number of epitaxial layers used for the VCSEL device structure may result in significant bowing and/or warping of the wafer which is particularly challenging in wafer handling and precision process steps for example, lithography on a large area wafers.

Figure 1B:
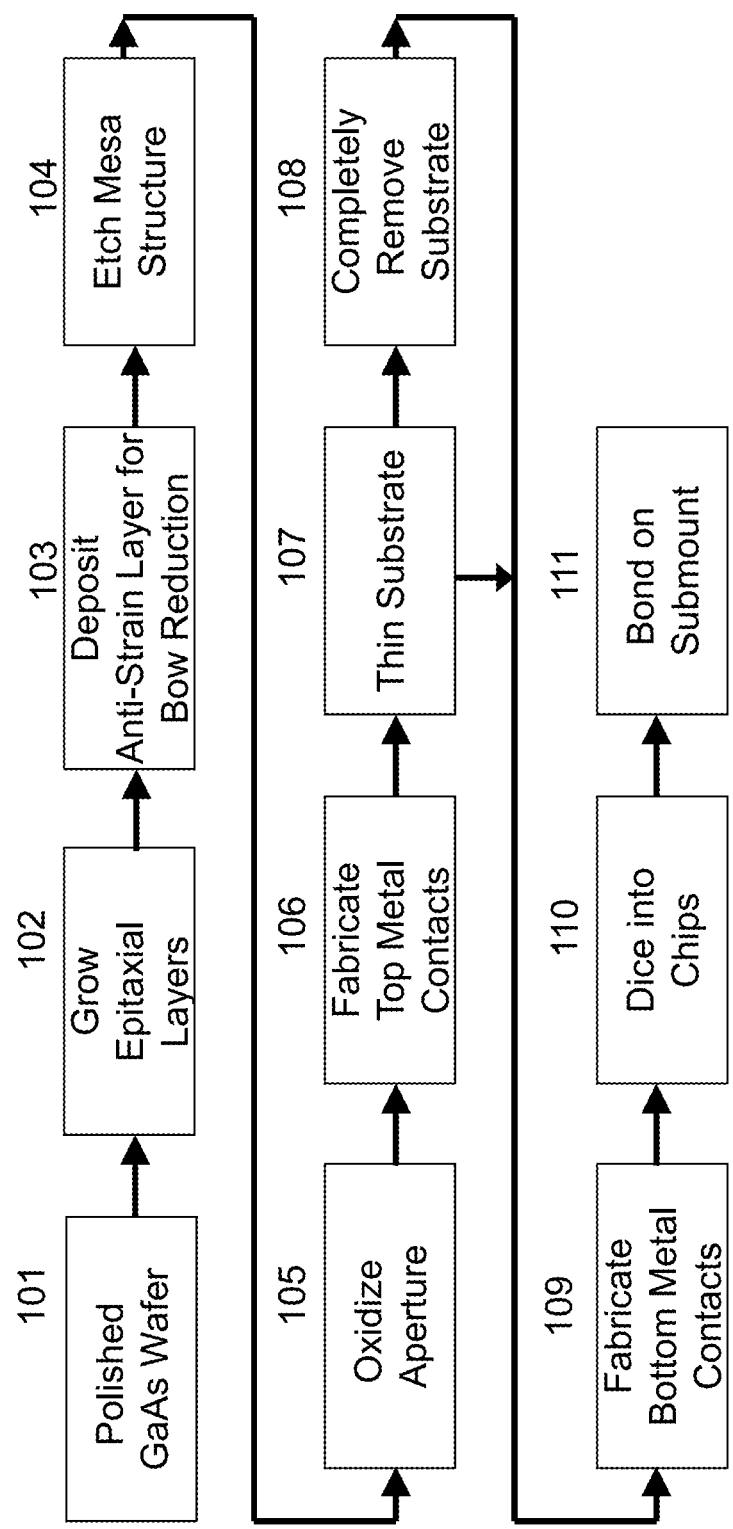
FIG. 1b is a flowchart showing an alternative process sequence for fabricating an improved VCSEL device.

In one embodiment of the invention a new sequence of processes is provided to mitigate the effect of bowing and/or warping. A schematic flowchart of the new process is shown in FIG. 1b. This process broadly follows almost all the basic steps as the prior art process shown in FIG. 1a except for an additional step labeled as 103 (blanked out as a grey box in FIG. 1a). For clarity and brevity, description of all the steps common between the two processes and similarly labeled in FIGS. 1a and 1b, will not be repeated. As an example the process will be described in reference with a GaAs substrate and GaAlAs based VCSEL devices. However, same principles may be applied broadly to VCSEL devices constructed using other materials systems designed for other wavelength regimes. In the new process shown in FIG. 1b, an additional step 103 is designed to remove or reduce the effect of the bowing and/or warping of the wafer resulting from a relatively large number of thin epitaxial layers. The process will be described in detail later.

Figure 2:
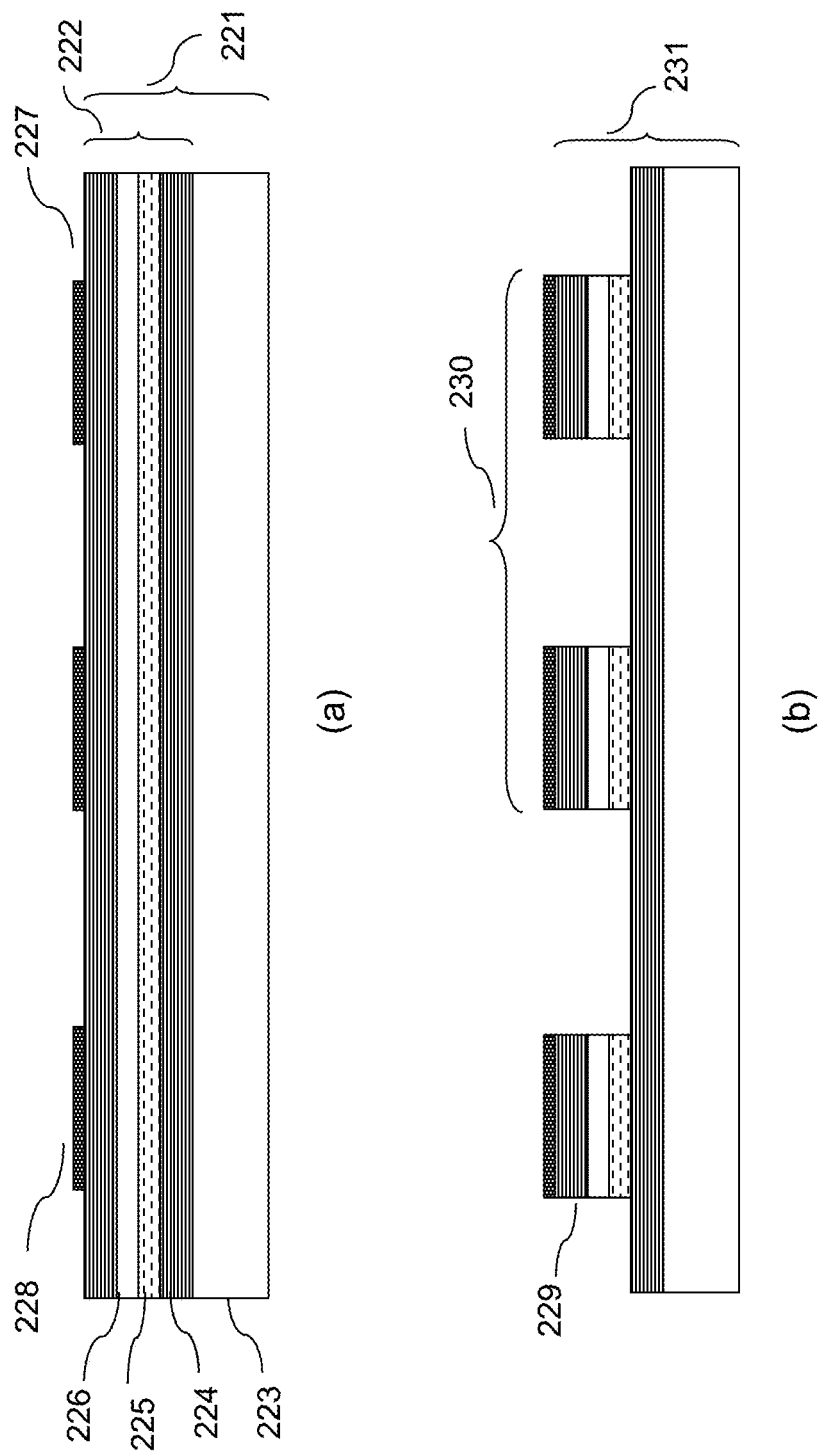
FIG. 2 schematically shows a VCSEL device structure grown on a semiconductor substrate—(a) epitaxial layers, and (b) mesa structures etched in the epitaxial layers defining individual VCSEL devices.
Figure 3:
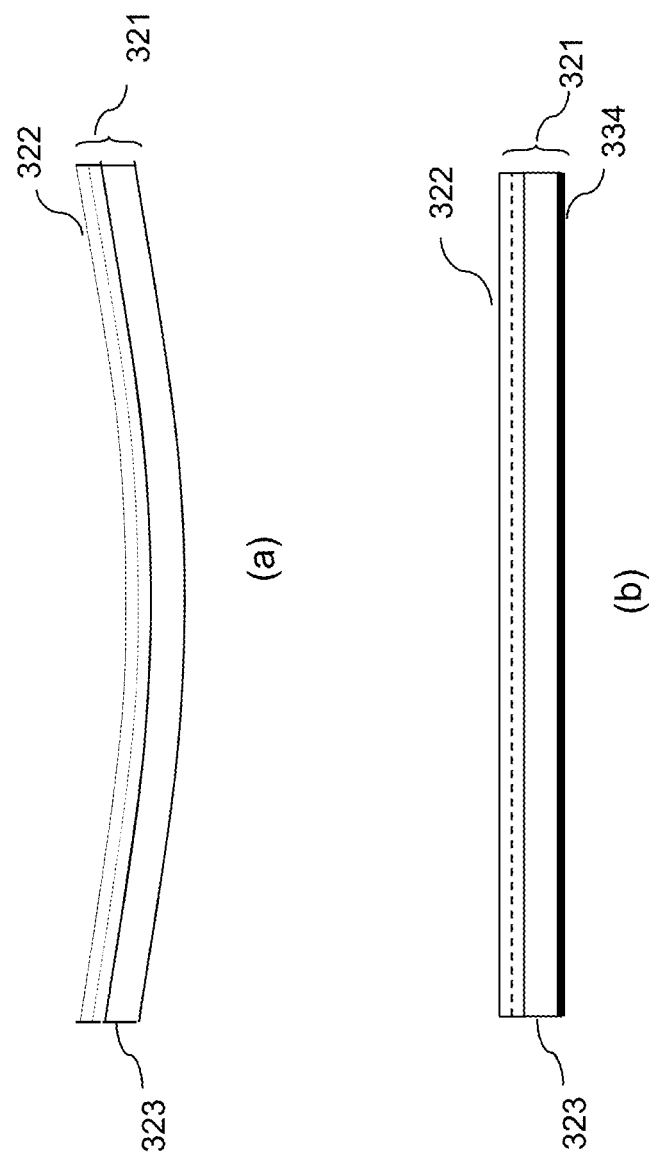
FIG. 3 is a schematic representation of a wafer surface following epitaxial layer growth—(a) wafer having a bow, and (b) relatively flat wafer resulting from the process according to this invention.
Figure 4:
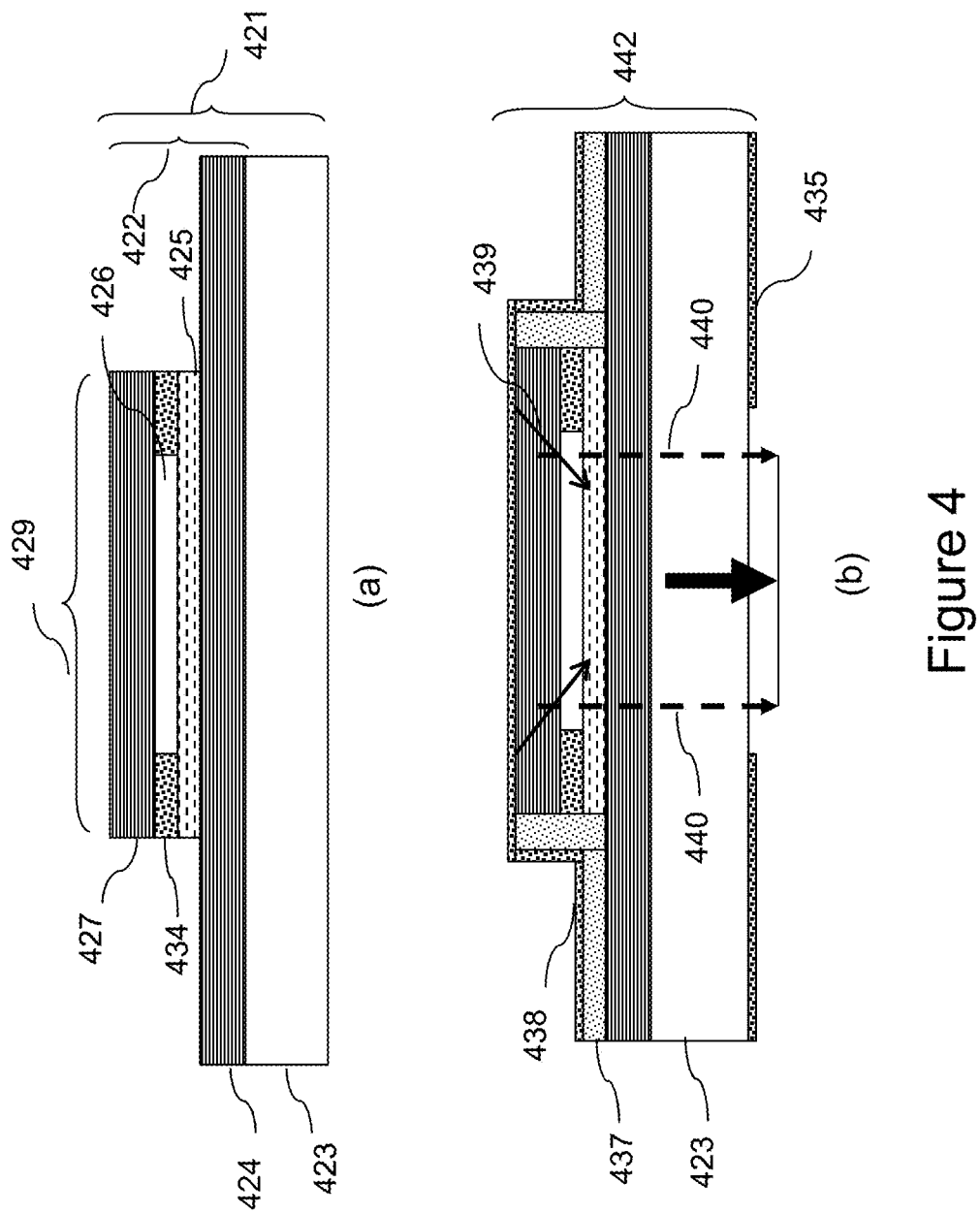
FIG. 4 shows close views of different process steps—(a) a single VCSEL device mesa after the oxidation process, and (b) VCSEL device mesa with a passivation layer and metallization.

In the following sections some of the important aspects of the VCSEL device processing will be highlighted in reference with FIGS. 2, 3 and 4. Referring now to FIG. 2(a) it shows a schematic representation of the basic layers of a VCSEL device structure. The basic layered structure 221 is grown on a semiconductor wafer substrate 223 for example, a GaAs substrate. However, substrate of other material and in general other III-V semiconductor material are equally applicable. In general, the substrate is a standard wafer four inches or larger in diameter and polished to a mirror finish on top and bottom surfaces. One advantage of both sides being polished is that the wafers may be batch processed up to a certain sequence, typically up to the epitaxial layer growth, following which the rest of the process is determined according to whether VCSEL devices need to be configured in top or bottom emission mode, as the need be for different application.

A plurality of epitaxial layers collectively shown as 222, are grown on a top surface (top surface of the substrate in the context of FIG. 2a). The stack of layers is grown in a particular sequence to construct different structural components (reflectors, active gain region, etc.) according to a pre-determined design of the VCSEL device. In each structural component the number of layers, composition and thickness of each layer is determined according to the specific VCSEL device design. More specifically, in this example group of layers 224 and 227, comprise the bottom and top DBRs, respectively, defining the VCSEL resonant cavity. A gain region including a plurality of layers 225 is placed between these two reflectors or mirrors. The gain region includes multiple quantum wells and in some designs may also include tunnel junctions.

An oxidation/aperture layer 226 having a composition suitable for wet or thermal oxidation is located between one of the DBRs and the gain region. Controlled oxidation of this layer generates a current confining aperture. In this exemplary design the gain in the active region is confined to a region of current flow determined by the current confinement aperture, the optical mode is also determined by the current confinement aperture. In a variant design, additional oxidation/aperture layer(s) that may be placed on either side of the gain region is included for additional apertures for implementing separate apertures for current and optical mode confinement. In addition to the layers necessary for construction of the VCSEL device, there are other layers (not shown here for clarity) including one or more layers for specific purposes such as, etch-stop layers, heavily doped contact layers to apply metallization for electrical contacts at appropriate places of the VCSEL device.

The large number of epitaxial layers grown for the VCSEL device structure results in significant bow and/or warp in the wafer, and in particular for large area wafers (4" diameter or larger) the bow and/or warp is detrimental to wafer handling for precision processes, such as lithography which is an essential step in VCSEL device processing to define the regions for etching mesa (228 in FIG. 2a). Referring now to FIG. 3(a), the collective epitaxial layers structure 322 contains many layers and the complex compositions of these epitaxial layers result in small deviations in the crystal structure dimensions from those of the substrate 323. The dimensional deviations of compositions in these layers, which are critical for proper device operation, cause stresses between the layers and the substrate and result in strains in the wafer.

As a consequence the wafer 321 (323 and 322 combined) exhibits bow and/or warp. Although FIG. 3(a) shows the bow curved towards the epitaxial layers, in some cases the bow may be in the reverse direction depending on whether the net dimension deviation in the epitaxial layers causes tensile or compressive stress, respectively, in the epitaxial layer structure. In view of this description, it can be very well appreciated that any processing step and in particular, any step that requires the wafer surface to be flat, may not be implemented with high level of precision. The effect of bow is more acute in processing a large area wafer having epitaxial layers.

In one aspect of this invention a process step is designed to remove or significantly reduce the bow. Referring now to FIGS. 1b and 3b, in the additional process step 103 (FIG. 1b) a film 334 is deposited at an elevated temperature on the bottom surface (the surface located opposite to the epitaxial layer stack) of the substrate (323 in FIG. 3(b)). The thickness and composition of the film is designed to have a significantly different thermal expansion coefficient than that of the epitaxial layer structure (322 in FIG. 3(b)). With the correct composition and thickness of the film 334, a stress opposite to that induced by the epitaxial layers is induced when the wafer is cooled to approximately room temperature. The magnitude of the opposite stress so generated is sufficient to cancel out the stress induced by the epitaxial structure.

A direct consequence of this additional process step (103 in FIG. 1b) is to reduce and practically eliminate the bow in the wafer 321 (323 plus 322) resulting in a very flat surface which is extremely beneficial in other processing steps. In addition, having a substantially flat surface is extremely beneficial in configuring a Vertical Extended Cavity Surface Emitting Laser (VECSEL) using a single external third reflector for the entire wafer—a device disclosed in the U.S. Pat. No. 8,675,706 issued on Mar. 18, 2014, to Seurin et al. Contents of the above patent co-authored by some of the inventors of this application and co-owned by Princeton Optronics Inc. Mercerville, N.J., is incorporated by reference in its entirety.

In a variation of the process an additional step of flatness measurement may be included in accordance to a procedure described in a co-pending and co-owned U.S. patent application Ser. No. 14/479,325 filed by Qing Wang on Sep. 9, 2014, the contents of which is incorporated by reference in its entirety and in particular, FIG. 9 and associated description in paragraphs [0073] and [0076]. It is noted that the strain relieving/compensation layer may or may not be a semiconductor and in particular, a III-V semiconductor layer, or a multi-layer epitaxial structure. Exemplary materials include but are not limited to, silicon dioxide, silicon nitride, a spin-on polymer such as, Benzocyclobutene (BCB), polyimide, and polymer photoresist such as SU8 (originally produced by MicroChem) with thicknesses typically ranging from 0.5 to 5.0 micrometers. Other materials having similar coefficient of thermal expansion, and/or a combination thereof, may be alternatively used for reduction of bowing and/or warping of the gallium arsenide substrate wafers.

An important step of the fabrication process is to etch mesas to define individual VCSEL devices on the wafer. Referring again to FIGS. 2a and 2b, mesas are defined on the surface of the epitaxial layer structure using photolithography. More precision is achieved in this step due to the fact the new process (FIG. 1b) includes a step of reducing or practically eliminating the bow in the wafer prior to the photolithography operation. The regions covered by the photoresist 228 (only one shown in FIG. 2a for clarity)

define the mesa geometry and the remaining areas of the epitaxial layer structure 222 is etched from the surface down to at least the etch stop layer 226 thereby separating the VCSEL device mesa structure to a desired height (depending upon the design) as shown in FIG. 2(b).

In the example shown in FIG. 2b, the mesa structures are etched down to the bottom DBR for complete electrical and optical isolation of each device. If desired an extra epitaxial layer is deposited during the growth or an existing layer is used as an etch stop layer to more accurately delineate the depth of the mesas. The VCSEL devices may be electrically connected to operate as single devices 229 or as two dimensional arrays 230. In a large area wafer 231, several individual VCSELs or VCSEL arrays are formed which after further processing are separated into chips. The process will be described later in detail.

One objective of this invention is to operate the VCSEL device at a high output power and with high reliability. In order to generate high gain for efficient high power operation of the VCSEL device the current needs to be concentrated in a smaller area of the gain layer. FIG. 4 shows an expanded view of a single mesa structure described in reference with FIG. 2. Each element in FIG. 4 is labeled with equivalent reference numeral as in FIG. 2 if applicable (for example, 223 and 423 for the substrate and so forth). Therefore description of elements common between FIGS. 2 and 4 will not be repeated. Instead, following discussion will be focused on the elements that are not described in FIG. 2.

Referring now to FIG. 4a, the VCSEL device comprises of DBRs 424 (bottom) and 427 (top), one each on either side of a gain region 425. Each of these regions includes multiple layers according to a pre-determined VCSEL design and imparts desired characteristics. The external dimensions of the VCSEL device is defined by a mesa structure 429. An aperture 434 is created by controllably oxidizing an oxidation/aperture layer 426 (aperture layer hereinafter) located above the gain region in the epitaxial layer structure 422 (shown collectively by a bracket) in this particular example. The aperture layer includes a material that oxidizes more rapidly as compared to the other layers in the epitaxial layer structure 422. The oxidation is performed at an elevated temperature in an atmosphere of nitrogen gas saturated with water vapor. The oxidation process starts from the outer edge of the mesa structure towards the center. The size or diameter of the aperture is determined by the duration of the oxidation which is the control parameter. In a different design, the aperture layer may also be located in another position in the stack or more than one aperture layer may be included at a desired position in the stack according to a different process design.

Referring now to FIG. 4b, one contact 435 to the VCSEL structure is applied to the bottom side of the substrate 423, whereas a second contact 438 to the VCSEL device is applied over a passivation layer 437 which covers the vertical sides around the mesa and the bottom DBR. The passivation layer also provides electrical isolation between the two electrical contacts 435 and 438 such that a current flows through the gain region instead of shorting the two ends of the VCSEL device. The aperture diameter, generally smaller than the mesa diameter confines current flow 439 to the central region of the mesa structure. In addition, the aperture also confines the optical mode 440 within the aperture so that the high gain is achieved in a small diameter and the laser emission (bold arrow) exhibits high output power. In this particular example the bottom DBR 424 is partially transmitting and the laser emission (shown as a bold arrow) is received from the substrate end of the VCSEL device.

However, the VCSEL device design is not limited to this configuration only. As an alternative the top DBR 427 may be made partially transmitting instead of the bottom DBR 424 such that the laser emission is received from a transparent window/aperture in the top DBR 424, in a top emission mode. These and many other configurations are possible and more details are disclosed in the U.S. Pat. No. 8,675,706 issued on Mar. 18, 2014, to Seurin et al., and a pending U.S. patent application Ser. No. 13/337,098 by Seurin et al. filed on Dec. 24, 2011. Contents of the above patent and the patent application co-authored by some of the inventors of this application and co-owned by Princeton Optronics Inc. Mercerville, N.J., are being incorporated by reference in their entirety.

Oxidation Process

As mentioned in the earlier discussion in reference with the process step 105 in FIGS. 1a and 1b, the oxidation/aperture layer is oxidized in a controlled fashion to create an aperture for current confinement as well as optical mode confinement. The composition of the oxidation/aperture layer is determined such that the oxidation process is rapid as compared to oxidation of the other layers in the epitaxial layer structure. Among many different oxidation processes that may be adapted for controlled oxidation to create an aperture in a VCSEL device most preferred method is a wet oxidation process. One method has been described in the European Patent Application Publication No. EP1496583. Another preferred method is to use a steam oxidation process described in the U.S. Pat. No. 6,898,215. In an improved method described in the U.S. Pat. No. 7,615,499, better control of the oxidation process is achieved by monitoring the process temperature closer to the wafers, for example at the wafer carrier thereby achieving a better temperature profile and control during the oxidation process.

In one aspect of the invention a new oxidation process is designed such that the oxidation can be carried out at lower temperature than conventional prior art processes. One objective of the new low temperature process is to have better control over the aperture size as well as to reduce the volume of oxide. An aperture size significantly smaller than the mesa size has an advantage in operating the VCSEL device at lower currents. However it is also important to limit the total volume of the oxide because thermal expansion rates of the oxide and the rest of gain region are vastly different. The problem is also addressed in the U.S. Pat. No. 6,949,473 where a post oxidation thermal annealing process is performed.

Figure 5:
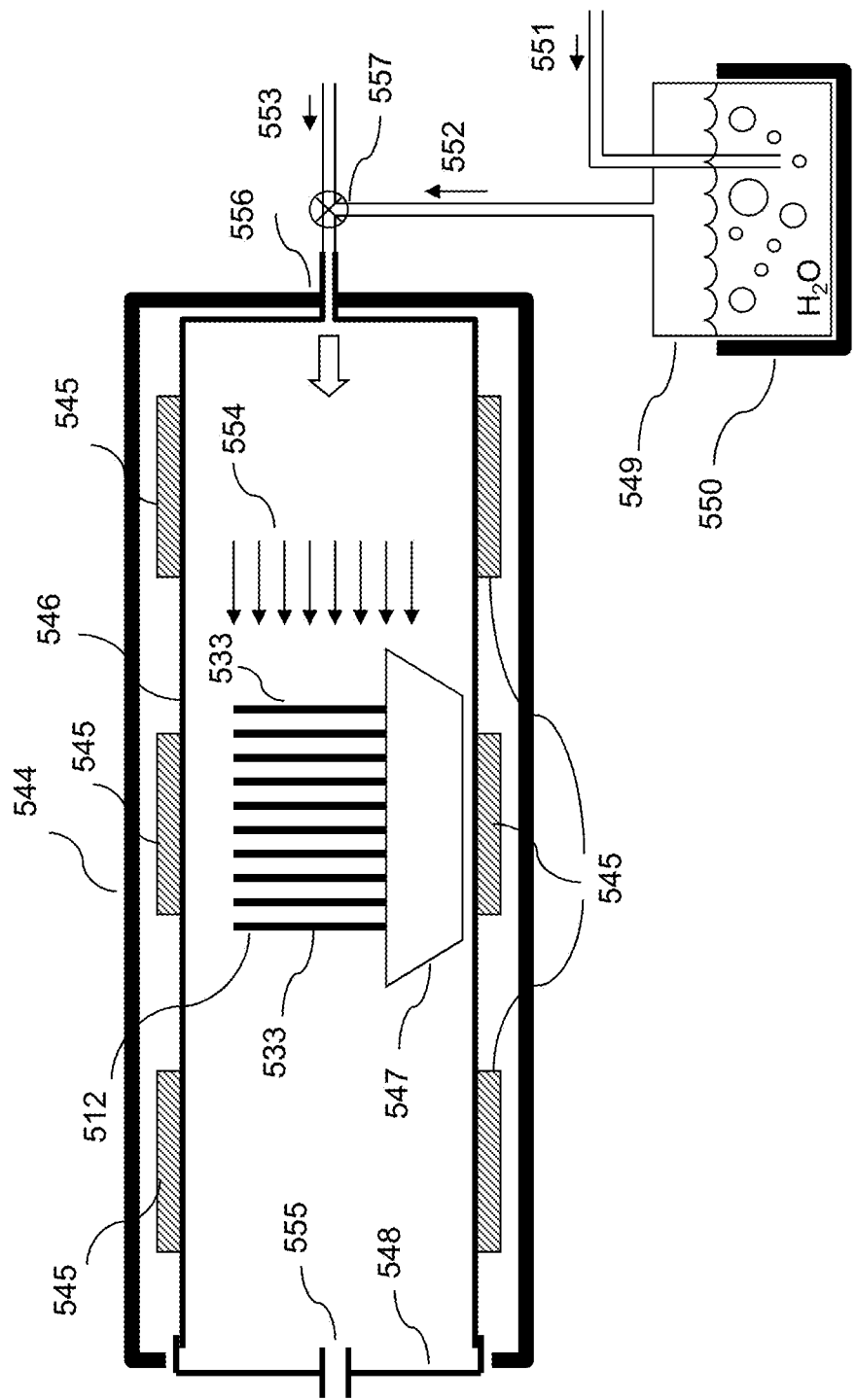
FIG. 5 is a schematic drawing of an exemplary oxidation furnace.

As mentioned earlier, the aperture size is determined by the oxidation rate. The oxidation rate depends on a number of parameters including furnace temperature, density of water vapor and uniformity of oxidation environment across the wafer surface. Thus to obtain precision control of the aperture size it is necessary to keep these parameters constant. A schematic of an exemplary multi-zone furnace for the oxidation process for volume production of large diameter wafers in accordance with the process design of this invention is shown in FIG. 5. More specifically, the 544 is a 3 zone furnace comprising a furnace liner (for example, a tube) 546 which is made of quartz, alumina or other suitable ceramic material. Heaters 545 surrounding the liner are located in the three zones to provide a uniform temperature zone. Typical furnace temperature used for low temperature oxidation may be selected to be less than 450° C., for example, between 350-450° C., and preferably between 365-430° C. for best results. The furnace has a door 548 on one end to place a wafer carrier (boat) 547, and an exhaust tube 555 is located on the opposite end, respectively. The carrier 547 is placed in the center of the furnace and is designed to hold a plurality of VCSEL wafers 512 stacked vertically in a row and spaced substantially equidistant. In a preferred process, the wafers are placed about four inches apart. Optional dummy wafers 533 are positioned at each end of the row of wafers to improve uniformity of oxidation of the wafers particularly those placed at the two ends of the stack.

The oxidizing environment in the furnace is created by bubbling nitrogen gas 551 through water heated in a container 549 surrounded by a heater 550. The nitrogen gas saturated with water vapor (oxidizing vapor) 552 is directed into the furnace through an inlet port 556. For consistent oxidation and desired oxidation rate, a preferred oxidizing vapor comprises nitrogen gas saturated with 100% water vapor. The distance between the inlet port and the carrier is designed to achieve a uniform flow 554 of the oxidizing vapor over the carrier containing the VCSEL wafers to provide uniform concentration of the oxidizing vapor and gas over the surface of the wafer. The oxidizing vapor exits the furnace tube through the exhaust tube 555. The oxidization process initiates at the edge of the mesa structure and process towards the center of the mesa structure. The oxidization process is terminated by stopping the oxidizing vapor flow and purging the furnace with an inert gas such as nitrogen 553 through a valve 557.

It is noted that due to various mechanisms that may induce stress in and around the aperture during the oxidation process, the oxidation process is quite critical in more than one way in achieving long term reliability. For example, a leading cause of stress during the oxidation process is rapid variation in temperature. An uneven temperature profile in the oxidation furnace would result in a temperature gradient across the wafer in an unpredictable manner. The oxidation furnace design described in reference with FIG. 5 in particular and the process according to this invention is conducive to providing uniform temperature across the wafer. In one preferred process the wafers are preheated in a separate auxiliary furnace prior to loading the wafers in the oxidation furnace, or heated at a slow rate in the oxidation furnace for example, at a preferred rate of 20° C./min., or lower.

It is known that a semiconductor material upon oxidation increases in size by a small amount. Due to unequal thermal coefficient of expansions of the oxide and the epitaxial layers structure, stress is generated in the region around the aperture and in particular the gain region, which facilitates interfacial defects to propagate in the epitaxial layers structure including the gain region, which would eventually impact the long term reliability of the VCSEL device. In one aspect of the invention, stress build up during the oxidation process is partially or fully relieved by slow cooling of the wafers after the oxidation process. This is achieved by either a) terminating the oxidizing vapor flow and reducing the furnace temperature slowly, or b) removing the wafers from the oxidation furnace and placing the wafers in a dry environment in an auxiliary furnace or oven and reducing the temperature slowly. For a preferred low stress oxidation to realize long term reliability, an optimum cooling rate is determined to be less than 20° C./min from experimental results. The long term reliability is determined in an accelerated testing procedure (to be described later).

Another factor that may contribute to stress in the gain region is the moisture in the oxidized semiconductor that is incorporated from the humid oxidation environment. Stress introduced due to moisture retained in the oxide may be minimized by placing the oxidized wafers in a vacuum chamber. An optimum time to minimize water content in the wafers may vary between about 10 min. to about 24 hours depending upon factors primarily including duration of oxidation and wafer size. In the new process oxidation typically proceeds from the edge of the mesa towards the center. The oxidation rate is controlled such that the oxide region forming the aperture is limited to about 10 µm or less from the mesa edge. The total volume of the oxide is thus limited, thereby reducing stress in the aperture and the gain region which inhibits propagation of interfacial defects.

For an exemplary oxidation process at a temperature of about 400° C. and a flow rate of 6 and 9 liters/minute an aperture having oxide thickness of up to about 10 µm from the edge towards the center of the mesa is achieved. The size of the aperture is determined by the mesa diameter minus twice the oxide thickness. Aperture sizes typically are between 3-400 µm in exemplary VCSEL devices constructed according to this process. The examples provided here are only illustrative and other combinations of temperature, flow rates and water vapor concentrations may be used to achieve a different oxidation rate according to the oxide thickness an aperture size requirement.

Process for Ultrathin VCSEL Device Wafer

One other objective of this invention is to design a process for high output power VCSEL device particularly suitable for large area wafers (Typically 4" diameter or larger) that is easily adaptable for large scale manufacturing. Operation of VCSEL device at high output power creates significant heat in the device that significantly raises VCSEL temperature and limits the output power and compromises performance. Therefore it is beneficial to design VCSEL device having good thermal conductivity for efficient heat dissipation. One preferred method is to bond the VCSEL device in the bottom emission mode, flat on a high thermal conductivity submount such that the VCSEL device is in physical and thermal contact with the submount and the substrate distal to the submount. In this configuration the laser emission is through the substrate.

While bonding the VCSEL device to the submount in bottom emitting configuration is effective in dissipating excess heat, it restricts the operating wavelength of the VCSEL device to those that are not absorbed in the substrate. For example, a VCSEL device constructed on a GaAs substrate the laser emission wavelengths shorter than 890 nm would be absorbed unless substrate thickness is reduced to a minimum or removed completely using a combination of polishing and chemical etching. To facilitate the process, conventionally a VCSEL device wafer is attached to a carrier (for example, a suitable substrate or another wafer) with the VCSEL device mesa in contact with the carrier. Since the wafer becomes very fragile during the thinning process, the carrier maintains the structural integrity of the VCSEL device. Additional stress may be induced in the VCSEL device if the surface in physical contact with the carrier is not substantially flat which may result in micro-mechanical damage to the VCSEL device structure, thereby compromising reliability.

Figure 6:
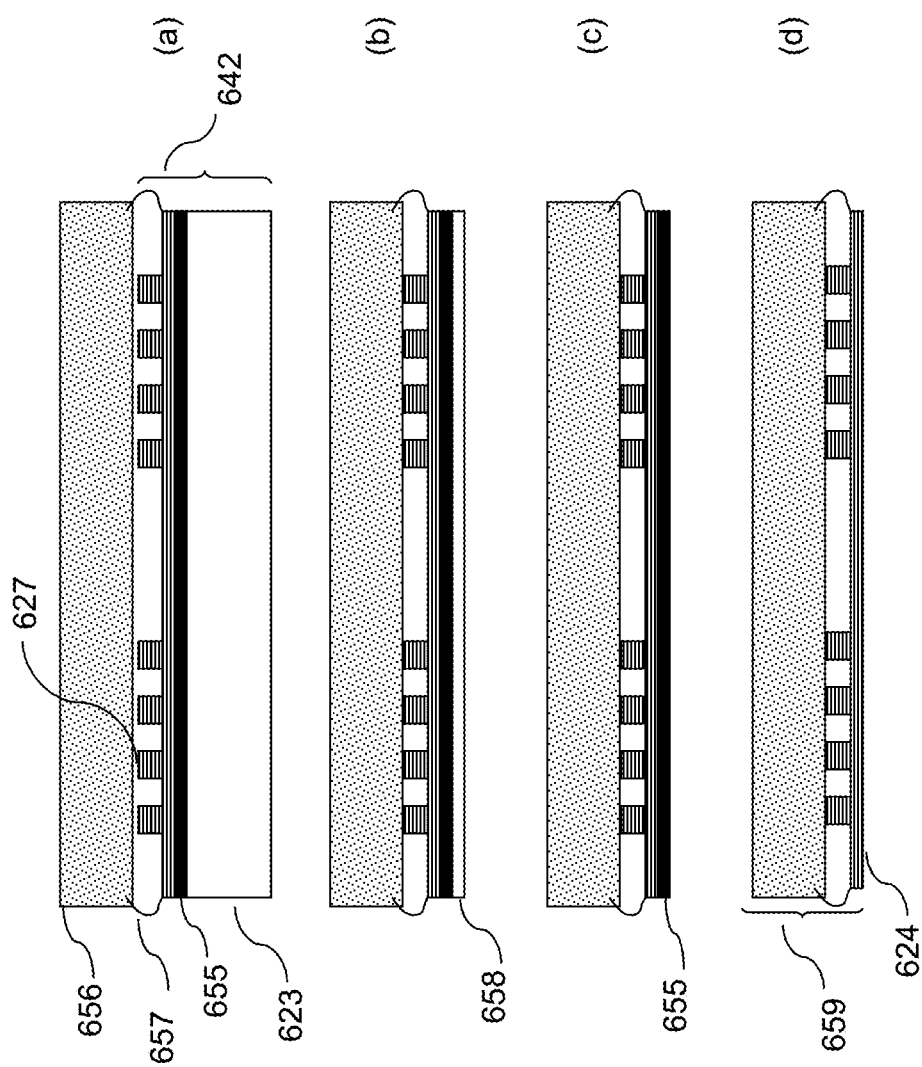
FIG. 6 is a schematic close up view representing some of the post processing steps of thinning the wafer—(a) wafer with a carrier substrate, (b) partially removed substrate with carrier substrate attached, (c) completely removed substrate and (d) after removal of an etch stop layer.

It may be recalled that the epitaxial layer structure having multiple layers may result in bowing and/or warping of the wafer due to stress induced during the epitaxial layer growth. Referring now to FIGS. 1*b*, 3*a* and 3*b*, a VCSEL device having a substantially flat surface according to the steps 103 (FIG. 1*b*) and FIG. 3*b* described earlier may be constructed following the processes outline in the earlier sections of this specification. Thus, it is ensured that the surface of the VCSEL device remains flat prior to attaching the carrier substrate. FIG. 6 schematically shows some of the important steps applied towards constructing a thin VCSEL device constructed on a large wafer, particularly suited to be used at high output power. Different stages of the process are shown in FIGS. 6a-6d. For clarity only FIG. 6a is labeled completely. Description of each label in FIG. 6a is applicable for similar parts in FIGS. 6b-6d as well, and only new process described in subsequent steps are labeled.

More specifically, FIG. 6(*a*) shows a VCSEL device wafer 642 that is made substantially flat in accordance with the process described earlier. Thinning of the substrate is performed prior to applying a bottom metallization. The wafer 642 is bonded to a carrier 656 using a non-permanent bonding agent 657. The top DBR 627 of the VCSEL device is positioned proximal to the carrier while the bottom surface of the substrate is free for polishing. The carrier may be of various materials including another substrate like GaAs, Si etc. The non-permanent bonding agent can, among others, be a standard commercial material especially designed for this purpose for example, WaferBond™ manufactured by Brewer Science. By way of example a top emitting VCSEL device is used for explaining the process but it should not be construed to be limiting.

The carrier/wafer assembly is mounted into a grinding/polishing machine and the substrate is carefully removed until a thin layer 658 is left as shown in FIG. 6(*b*). For some application VCSEL device with a thinned substrate may be adequate and a metallization layer is applied on the thinned substrate. For some applications it is preferred that the substrate is completely removed. To fully remove the substrate the carrier/wafer assembly is then placed in an etcher to remove the remaining substrate layer as shown in FIG. 6(*c*). An optional etch stop layer 655 is often grown between the VCSEL structure and the substrate 623 during the wafer growth and prior to the growth of the epitaxial layer structure. The etch stop layer is a semiconductor layer, such as AlGaAs, which does not etch or etches much slower than the substrate so as to prevent accidental etching of the epitaxial layer structure of the VCSEL device. Finally another etch process is used to remove the etch stop layer 655 revealing the bottom DBR 624 or a contact layer (not shown), in the carrier/wafer assembly shown in FIG. 6(*d*).

Figure 7:
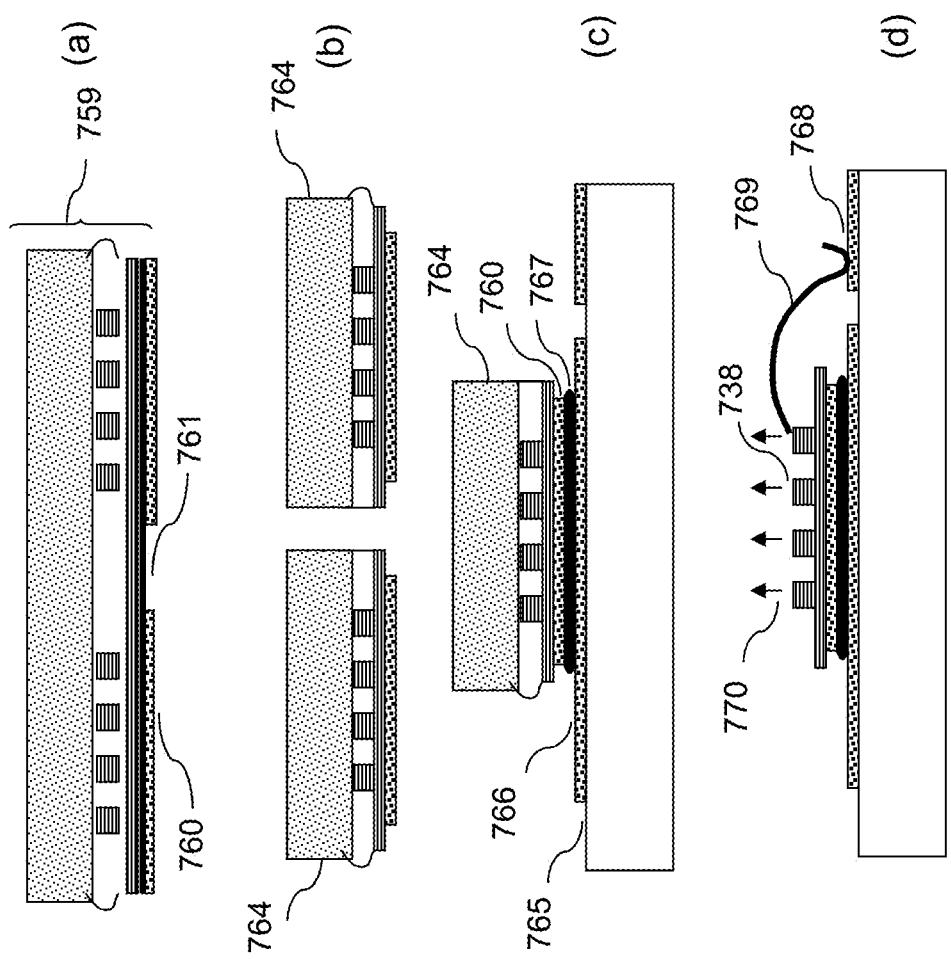
FIG. 7 shows schematic close up view of wafer processing steps after thinning the wafer and metallization—(a) the carrier substrate with the wafer diced into chips of individual VCSEL devices, (b) chips bonded to a submount, (c) the carrier removed and (d) wire bonding.

Referring now to FIG. 7, once the substrate is etched the VCSEL device wafer is completely supported on the carrier for metallization. As shown in FIG. 7(*a*), a metallization layer 760 is applied to the bottom DBR side of the VCSEL device. A heavily doped contact layer (not shown) is usually deposited over the etch stop layer in the epitaxial layer structure for a low resistivity electrical contact. A space 761 is patterned in the contacts where the VCSEL devices are diced for separating into individual chips. The VCSEL devices are diced with the carrier into single VCSEL (not shown) or VCSEL arrays 764 as shown in FIG. 7(*b*). The diced devices (also referred as VCSEL chips) may be used to integrate these optical emitters with other electronic devices for various applications.

The VCSEL devices or arrays are mounted on submounts 765, preferably a thermal submount using one of many methods known in the art including soldering or epoxy bonding. More specifically, the VCSEL device is bonded to a bonding pad 766 on the submount for electrical connectivity using an electrically conducting material (FIG. 7*c*). The VCSEL device thus supported on the submount has the necessary mechanical support and the carrier is separated by removing the non-permanent boning agent. A second electrical connection is made between a top metal contact 738 to a bonding pad 768 on the submount using for example, a wire bond 769 (FIG. 7*d*). The heat generated in the VCSEL device is dissipated through the submount which is in physical and thermal contact with the VCSEL device. In a variant embodiment the submount may be selected to be a thermal submount for efficient heat dissipation. In another aspect, the VCSEL chip may be mounted in physical and thermal contact with a heat dissipation region built in to a PCB.

Substrate Through-Hole VCSEL Device

Figure 8:
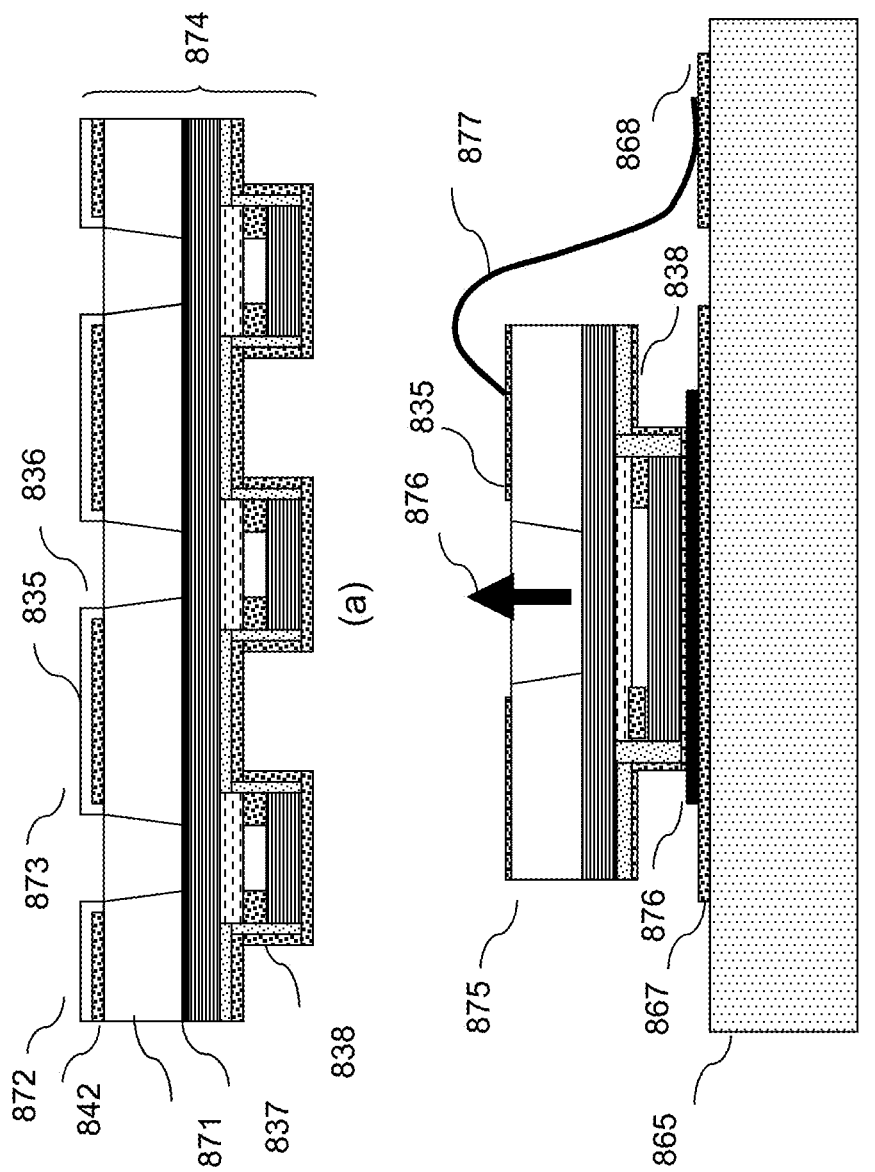
FIG. 8 shows a process to etch optically transparent vias in the substrate above each VCSEL device to allow propagation of the laser beam.

The process of mounting the devices on a submount described in the previous section is described for a top emitting device, the same process is applicable to a bottom emitting device. However, there are alternative processes particularly suitable for bottom emitting VCSEL device. In the process schematically shown in FIG. 8, apertures or through holes are created in the VCSEL device substrate for laser emission. The process may be readily applied to a completed VCSEL device wafer with top and bottom metallization contacts. The VCSEL device structure is substantially similar to the VCSEL device shown in FIG. 4*b* and the same description applies. That description will not be repeated for brevity. In this process the metallization 835 on the substrate is patterned using a photoresist mask 873 as shown in FIG. 8*a*. Windows 836 are opened in the photoresist mask to etch the substrate. Preferably, an etch stop layer 871 is grown between the bottom DBR and the substrate during the growth of the epitaxial layers structure. The substrate exposed between the photoresist mask is etched down to the etch stop layer to create holes for the laser emission.

Individual VCSEL device or an array of VCSEL devices are diced into chips 875 shown in FIG. 8*b*. The VCSEL devices are bonded to a submount 865 such that the metallization 838 the on mesa structure of the VCSEL device is in physical and electrical contact with a bonding pad 867 on the submount. The bonding is facilitated with a bonding substance 876. A second connection from the metallization layer 835 on the substrate is made to a contact pad 868 on the submount using a wire bond or ribbon bond 877. The laser emission 876 is through the hole 836 (FIG. 8*a*). One advantage of this configuration is that there are less number of processing steps and lower probability of stress propagation. Furthermore, the VCSEL device is in thermal contact with the submount which can be bonded to a heat sink thereby cooling the VSEL device more efficiently which facilitates high power operation of the VCSEL device.

Low Temperature Metallization

Standard metal deposition processes use high temperature of up to 400° C. to obtain good adhesion of the metal contact to the semiconductor material of the VCSEL and form a low electrical resistance connection. High temperature process may introduce defects into the VCSEL device and also degrade the properties of the device elements fabricated in earlier process steps. One aspect of the invention to provide a low temperature metallization process for the VCSEL device constructed according to this invention which is particularly suited for ultrathin wafer VCSEL devices but is not limited to these devices. A schematic process sequence is shown in FIG. 9.

Figure 9:
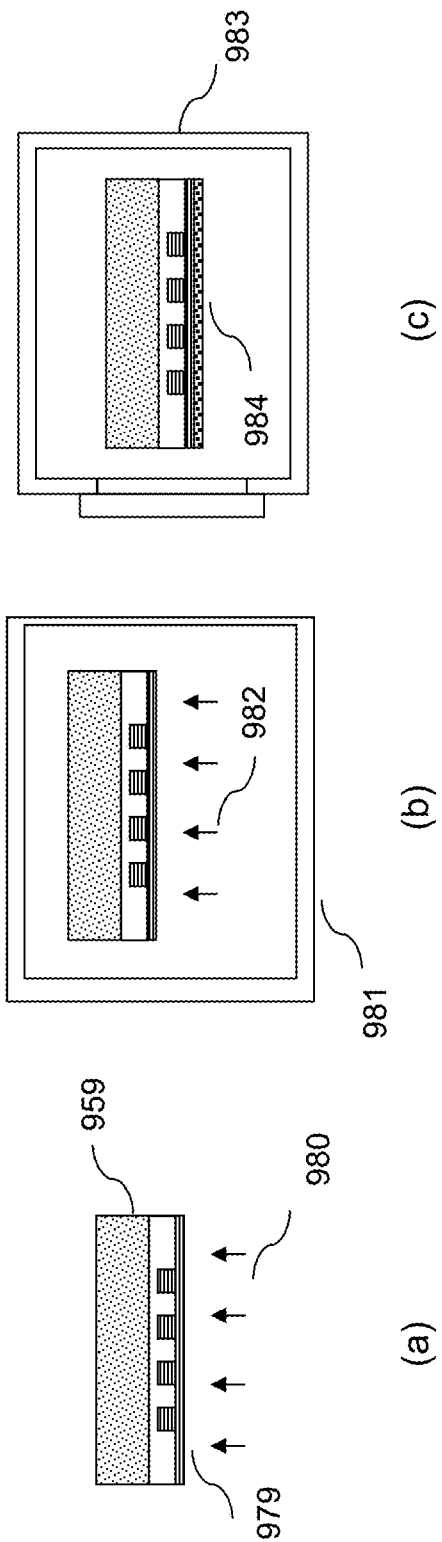
FIG. 9 shows schematic representation of low temperature metallization steps for electrical contact formation—(a) chemical cleaning of the surface, (b) metallization in a vacuum chamber and (c) heating/alloying in a low temperature furnace to form the electrical contact to the semiconductor material.

The first step in the low temperature metallization process in accordance with this invention is shown in FIG. 9(*a*). It is noted that the semiconductor surface/layer to be metallized for electrical contacts to the VCSEL device is doped with specific metals that interact with the contact metal. More specifically, a semiconductor surface 979 to be metallized is exposed to a chemical wetting process 980 for cleaning. The VCSEL wafer 959 is then immediately transferred to the metal deposition chamber 981, preferably in a vacuum or inert atmosphere. A plurality of metals 982 is deposited in sequence each to a specific pre-determined thickness, on to the cleaned surface. The VCSEL wafer 984 with the metals deposited is subsequently heated to the relatively low temperature of up to a maximum of 200° C. which alloys and/or diffuses various constituents into the semiconductor surface/layer to form the electrical contact. The heating can be performed in the deposition chamber or in a separate oven 983 as shown in FIG. 9(*c*).

Alternatively, low temperature heating may also be performed in a rapid infrared heating furnace also known as Rapid Thermal Annealing (RTA) furnace. The parameters for semiconductor doping and the metal constituents have been optimized so that the low temperature heating forms a reliable low resistivity electrical contact. Some of the metals that are used include titanium, platinum and gold but can also include nickel, germanium and palladium.

Etching Method for Dicing Wafer into Chips

Figure 10:
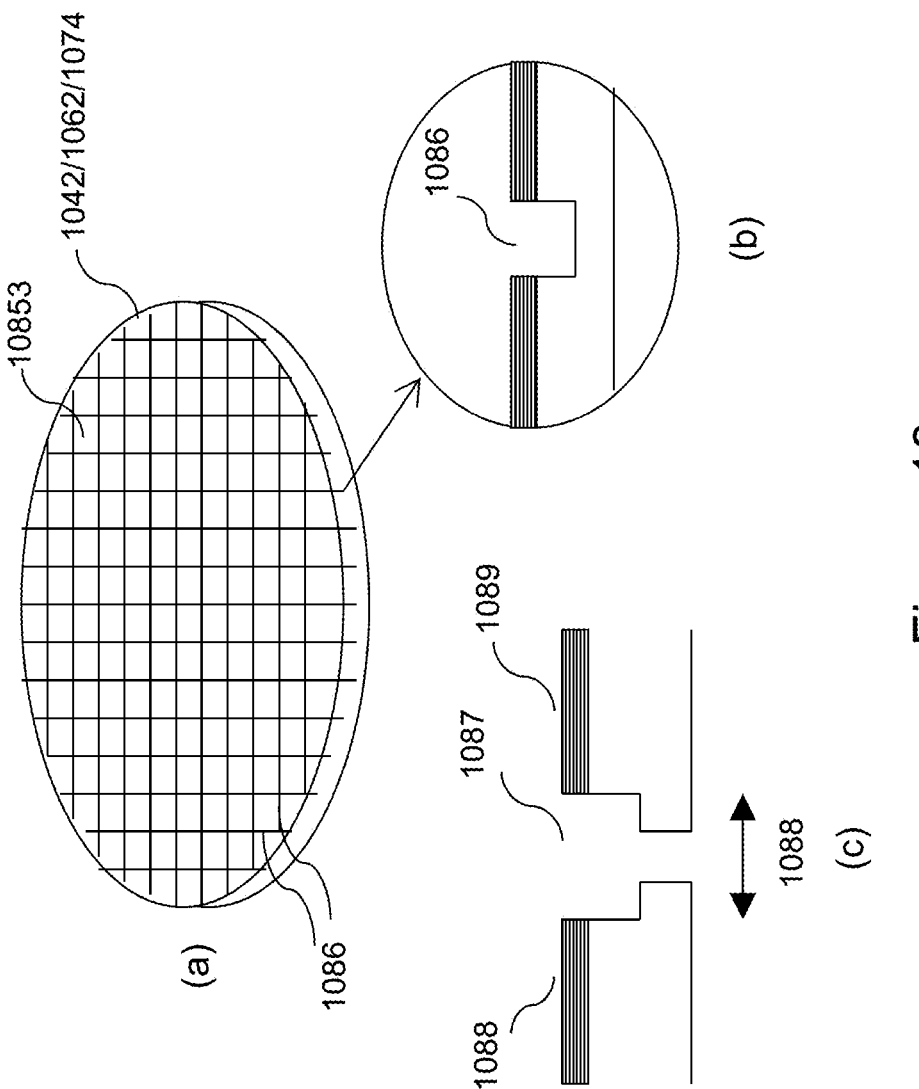
FIG. 10 is a schematic representation of a preferred dicing process.

As a final step of processing VCSEL devices is to separate the individual VCSEL device or array chips from the wafer. Conventional method of scribing and breaking or dicing with a saw may induce defect formation/propagation in the epitaxial layers structure resulting in stress which affects stability and therefore reliability. A more reliable process is to etch grooves at separation lines (create using a lithography step) using dry etching. Steps of an exemplary process are shown in FIG. 10. More specifically, FIG. 10(*a*) shows a VCSEL device wafer 1042/1062/1074 along with the dicing lines 1086 delineating the VCSEL chips 1085. The dicing lines are defined in a photolithography step and a portion of the VCSEL device epitaxial layer structure is etched down to the substrate using Reactive Ion Etching (RIE) to separate adjacent device or arrays.

FIG. 10(*b*) schematically shows an enlarged view of a groove 1086. For an ultrathin VCSEL device wafer (similar to those shown in FIGS. 6 and 7) the groove is etched through the VCSEL epitaxial structure and into a portion of the carrier or the thinned substrate. Alternative etching processes such as Inductively Coupled Plasma (ICP) or even wet etching may also be used. The chips 1088 and 1089 are separated at the gap 1087 by breaking them apart or by using a dicing saw to cut through substrate or carrier. One objective of adopting the etching process is to protect the VCSEL device epitaxial layers structure from stress and therefore improving reliability. The process is very precise in preventing defects caused by breaking or dicing the substrate or carrier to propagate into the VCSEL device epitaxial layer structure.

Long-Term Reliability

As mentioned earlier, the steps adopted in the fabrication of VCSEL devices in accordance with this invention are also described in prior art processes. One advantage of the process described in this invention is that the strain induced in the wafer due to epitaxial layers growth is successfully mitigated resulting in a substantially flat wafer after all the epitaxial layers necessary for the VCSEL device are grown. Effectiveness of this particular step in preventing defects in the VCSEL device structure is reflected in long term test results to be described shortly. While many of the processes are known in the art, a precise combination of processes including low temperature oxidation, low temperature metallization and dicing method adopted in this invention has been very successful in improving reliability of VCSEL devices and is reflected in the data shown graphically in FIG. 11.

Figure 11:
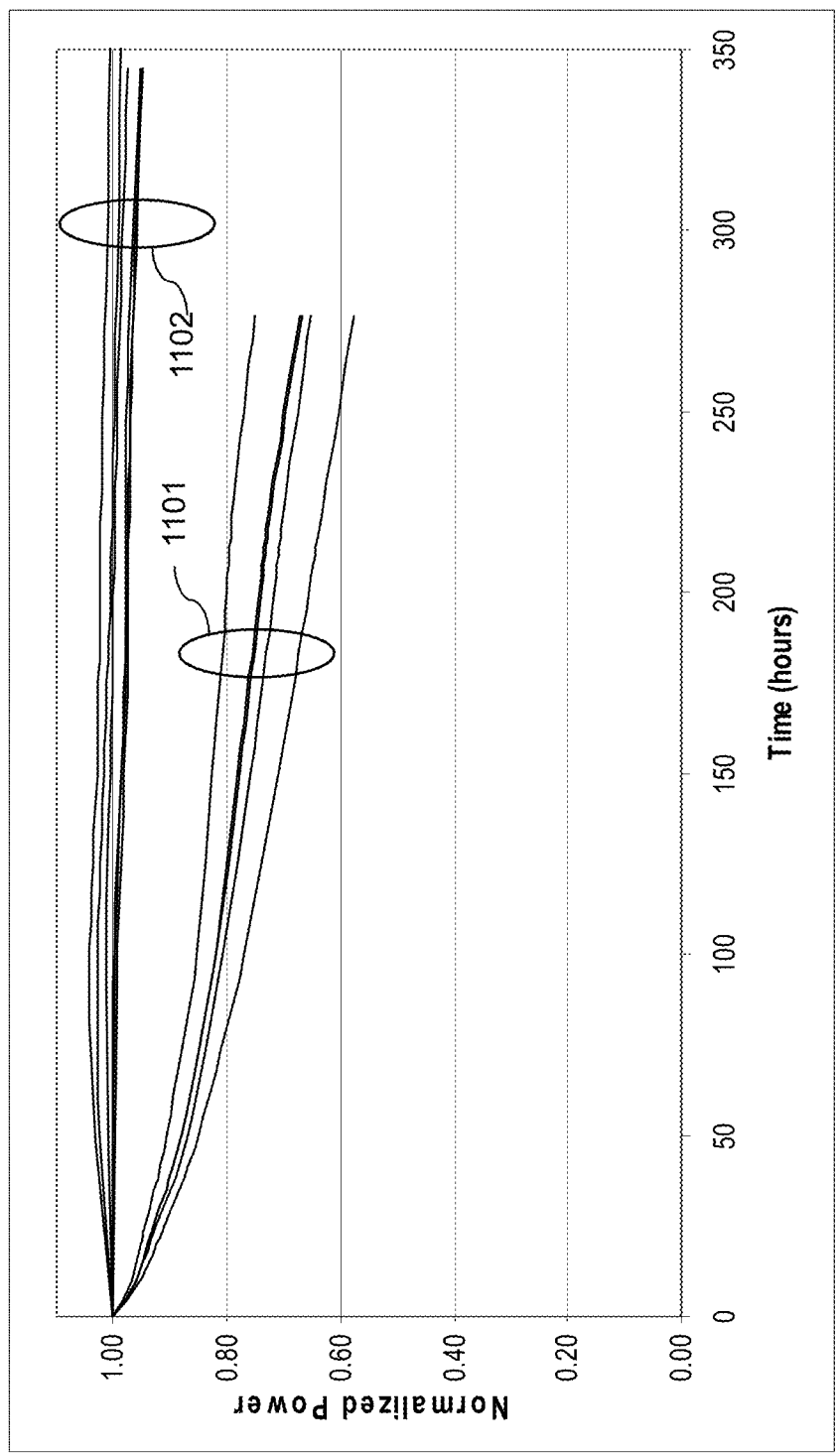
FIG. 11 is a plot showing comparative reliability results for VCSEL device fabricated using the standard process and significantly improved results using a process according to this invention.

More specifically, reliability results are obtained for VCSEL arrays operating at 808 nm, at an output power of 2.5 W continuous wave (CW) output, and ~50° C. ambient temperature in a reliability test station. These operating conditions represent an accelerated test procedure above the normal operating conditions. FIG. 11 shows normalized optical output power (y-axis) emitted from several VCSEL devices and in particular VCSEL array devices as a function of time (x-axis). The reliability of VCSEL devices are tested on several devices from two groups. VCSEL devices in one group (1101) are constructed according to a standard process similar to one shown in FIG. 1*a* (1101). The VCSEL devices (1102) in the second group are constructed according to the new process shown in FIG. 1*b* (1102).

More specifically, measured normalized power for almost all the devices in both groups (1101 and 1102) in the beginning is substantially similar. However, as time elapses measured output power from the first group of devices (1101) show gradual degradation. For example, after 100 hours of operation, output power shows a drop of about 75-85% of the output power measured in the beginning of the testing process. Furthermore, there is a considerable spread in the data. When operated for longer time, the output power degraded further (about 65-80% of the original output power after 200 hours of operation). At the same time the spread in the output power also increased further.

Turning now to the data obtained from VCSEL array devices constructed according to the new method in group 1102, there is practically no degradation in output power even after 250 hours of operation under accelerated conditions described earlier. Furthermore, the spread in the data is also very small. As compared to the VCSEL array devices constructed according to the standard process the VCSEL devices constructed according to the new process show better long term performance by about 20% or more (practically no degradation after much longer operation time). Accordingly, the long-term reliability of the VCSEL array devices constructed according to the new processes show about a factor of 20 times or more improvement.

Although a broad framework of the invention is described with reference to several processes, more reliable VCSEL devices including single devices and arrays may be constructed by selecting all or some of these processes in combination or sub-combinations that may be apparent to those skilled in the art according to the requirement and applications. Variations and modifications of different combinations and sub-combinations that will be apparent to those skilled in the art are within the scope of the invention and are covered by appended claims.

What is claimed is:

1. A process of fabricating a VCSEL device wafer comprising the steps of:

providing a semiconductor substrate;

growing in a pre-determined sequence, a stack of one or more epitaxial layers of semiconductor material including the steps of growing at least a first reflector, a gain region and a second reflector according to a pre-determined design of a VCSEL device structure for a desired output characteristics, on one surface of the semiconductor substrate;

growing additional one or more epitaxial layer including at least one oxidation layer, at respective pre-determined location relative to the gain region;

etching a plurality of mesas of a pre-determined size and to a pre-determined depth not to exceed the thickness of the stack of one or more epitaxial layers;

oxidizing the at least one oxidation layer to a desired width from the edge towards the center of the plurality of mesas, thereby creating within the plurality of mesas, a respective plurality of apertures smaller in diameter with respect to the corresponding mesas; and growing to a pre-determined thickness, a strain compensation layer on a second opposing surface of the semiconductor substrate, such that the VCSEL device wafer including the semiconductor substrate, the one or more epitaxial layers and the strain compensation layer is substantially free of bow and/or warp.

2. The process of fabricating the VCSEL device wafer as in claim 1, wherein the step of providing the semiconductor substrate further including a step of at least polishing the one surface of said semiconductor substrate to a desired mirror finish preceding said step of growing the stack of one or more epitaxial layers.

3. The process of fabricating the VCSEL device wafer as in claim 1, wherein said step of growing the stack includes further steps of growing additional one or more epitaxial layer at pre-determined time intervals such that growing of said one or more epitaxial layer occurs at respective pre-determined location relative to the gain region, wherein said additional one or more epitaxial layer is one selected from a group consisting of each one or more of etch stop layer, second oxidation layer, contact layer, and a combination thereof.

4. The process of fabricating the VCSEL device wafer as in claim 1 including a step of growing the at least one oxidation layer proximal to the gain region.

5. The process of fabricating the VCSEL device wafer as in claim 1 wherein said step of oxidizing is performed at a temperature lower than 450° C., preferably between 350-450° C.

6. The process of fabricating the VCSEL device wafer as in claim 1, wherein the step of growing the strain compensation layer is effected through depositing a 0.5 to 5.0 micrometer thick layer comprising a material that is one selected from a group consisting of a semiconductor, silicon dioxide, silicon nitride, spin-on polymer, polyimide, and polymer photoresist.

7. The process of fabricating the VCSEL device wafer as in claim 1 including a further step of reducing the thickness of the semiconductor substrate.

8. The process of fabricating the VCSEL device wafer as in claim 3, wherein said pre-determined time interval between growing of a second oxidation layer is selected to facilitate positioning of said second oxidation layer preferably distal to the at least one oxidation layer, and including a further step of oxidizing the second oxidation layer to a desired width from the edge towards the center of the plurality of mesas, thereby creating a respective plurality of second apertures within the plurality of mesas smaller in diameter with respect to the corresponding mesas.

9. A process of fabricating a VCSEL device wafer comprising the steps of:

providing a semiconductor substrate;

growing in a pre-determined sequence, a stack of one or more epitaxial layers of semiconductor material on one surface of the semiconductor substrate, wherein said step of growing the stack of one or more epitaxial layers includes configuring at least a first reflector, a gain region, an oxidizing layer proximal to the gain region and a second reflector according to a pre-determined design of a VCSEL device structure for a desired output characteristics;

growing a strain compensation layer on a second opposing surface of the semiconductor substrate to a pre-determined thickness, such that the VCSEL device wafer including the semiconductor substrate, the one or more epitaxial layers and the strain compensation layer is substantially free of bow and/or warp;

etching a plurality of mesas of a pre-determined size and to a pre-determined depth not to exceed the thickness of the stack of one or more epitaxial layers;

oxidizing the oxidation layer to a pre-determined width from the edge towards the center of the plurality of mesas, thereby creating within the plurality of mesas, a respective plurality of apertures, each smaller than the size of the corresponding mesas; and applying metal contacts to a pre-determined first and second layers for providing respectively, first and second electrical connections to the VCSEL device structure.

10. The process of fabricating the VCSEL device wafer as in claim 9, wherein the step of providing the semiconductor substrate further including a step of at least polishing the one surface of said semiconductor substrate to a desired mirror finish preceding said step of growing the stack of one or more epitaxial layers.

11. The process of fabricating the VCSEL device wafer as in claim 9, wherein said step of growing the stack includes further steps of growing additional one or more epitaxial layer at respective pre-determined location relative to the gain region, wherein said additional one or more layer functioning as one selected from a group consisting of etch stop layer, oxidation layer, contact layer, and a combination thereof.

12. The process of fabricating the VCSEL device wafer as in claim 11, wherein said step of applying metal contacts to the pre-determined first and second layers is performed on respective first and second contact layers of the stack, for providing respectively, the first and second electrical connections to the VCSEL device structure.

13. The process of fabricating the VCSEL device wafer as in claim 9 including a step of growing a second oxidation layer preferably distal to the oxidation layer, and including a further step of oxidizing the second oxidation layer to a desired width from the edge towards the center of the plurality of mesas, thereby creating a respective plurality of second apertures within the plurality of mesas smaller in diameter with respect to the corresponding mesas.

14. The process of fabricating the VCSEL device wafer as in claim 9 wherein the step of growing the strain compensation layer is effected through depositing a 0.5 to 5.0 micrometer thick layer comprising a material that is one selected from a group consisting of a semiconductor, silicon dioxide, silicon nitride, spin-on polymer, polyimide, and polymer photoresist.

15. The process of fabricating the VCSEL device wafer as in claim 9 including a step of reducing the thickness of the semiconductor substrate preceding the step of metallization.

16. The process of fabricating the VCSEL device wafer as in claim 9, wherein said step of applying metal contacts is performed at a low temperature of 200° C., or preferably lower.

17. The process of fabricating the VCSEL device wafer as in claim 9 including an additional step of dicing VCSEL device structures on the wafer, wherein said step of dicing is facilitated by an additional step of etching grooves on one surface of the VCSEL device wafer, and wherein said step of etching is one selected from the group consisting of Reactive Ion Etching, Inductively Coupled Plasma (ICP), chemical etching and a combination thereof.

18. The process of fabricating the VCSEL device wafer as in claim 9 wherein said step of oxidizing is performed at a temperature lower than 450° C., preferably between 350-450° C.

\* \* \* \* \*